(12) United States Patent  (10) Patent No.: US 8,570,113 B2
Fischette  (45) Date of Patent: Oct. 29, 2013

(54) DIGITAL VCO CALIBRATION METHOD AND APPARATUS

(75) Inventor: Dennis M. Fischette, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 107 days.

(21) Appl. No.: 12/821,534

(22) Filed: Jun. 23, 2010

(65) Prior Publication Data

US 2011/0316639 A1  Dec. 29, 2011

(51) Int. Cl.
*H03L 5/00* (2006.01)
*H03L 7/08* (2006.01)

(52) U.S. Cl.
USPC .............................. 331/183; 331/15; 331/17

(58) Field of Classification Search
USPC ..................................... 331/15, 182, 183, 17
See application file for complete search history.

(56) References Cited

U.S. PATENT DOCUMENTS

| 5,382,922 | A  | * | 1/1995  | Gersbach et al. | 331/1 A |
| 6,275,115 | B1 | * | 8/2001  | Egawa | 331/11 |
| 6,587,005 | B2 | * | 7/2003  | Ichihara | 331/16 |
| 6,624,706 | B2 | * | 9/2003  | Higashi et al. | 331/17 |
| 6,646,512 | B2 |   | 11/2003 | Abassi |  |
| 6,859,108 | B2 |   | 2/2005  | Abassi |  |
| 7,471,158 | B2 | * | 12/2008 | Han et al. | 331/17 |
| 7,471,159 | B2 | * | 12/2008 | Eun Lee et al. | 331/17 |
| 7,612,617 | B2 | * | 11/2009 | Pullela et al. | 331/16 |
| 7,907,021 | B2 |   | 3/2011  | Chen |  |
| 7,940,140 | B2 |   | 5/2011  | Zeng |  |
| 8,085,098 | B2 | * | 12/2011 | Yamazaki | 331/10 |
| 8,274,339 | B2 | * | 9/2012  | Fan et al. | 331/176 |
| 2003/0025566 | A1 | * | 2/2003 | Rogers | 331/109 |
| 2010/0090768 | A1 | * | 4/2010 | Yamazaki | 331/15 |

* cited by examiner

*Primary Examiner* — Levi Gannon
(74) *Attorney, Agent, or Firm* — Rory D. Rankin; Meyertons, Hood, Kivlin, Kowert & Goetzel, P.C.

(57) ABSTRACT

A method and circuitry for calibrating the gain of a VCO (voltage controlled oscillator) is disclosed. In one embodiment, a circuit includes a comparator configured to provide a first indication if the VCO gain is not within the specified gain range, and a second indication if the VCO is within the specified gain range. The circuit further includes a control unit configured to, upon occurrence of at least a first cycle of a clock signal, cause adjustment of the VCO gain responsive to receiving the first indication. For each one or more successive cycles of the clock signal, the control unit is configured to cause corresponding adjustments of the VCO gain until the comparator provides the second indication. The control unit is configured to discontinue adjustments to the VCO gain responsive to receiving the second indication.

19 Claims, 7 Drawing Sheets

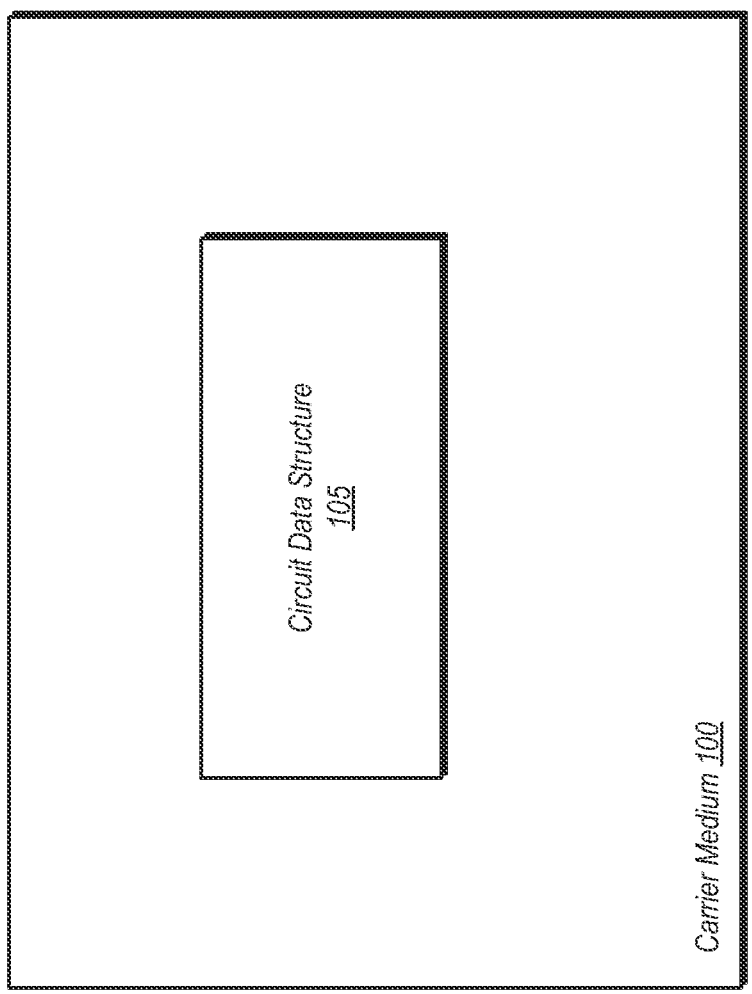

US 8,570,113 B2

DIGITAL VCO CALIBRATION METHOD AND APPARATUS

BACKGROUND

1. Field of the Invention

This invention relates to electronic circuits, and more particularly, to voltage controlled oscillators (VCOs).

2. Description of the Related Art

Phase-locked loops (PLLs) are commonly used for the generation of oscillating signals in a wide variety of electronic circuits. For example, PLLs may be used in digital circuits for clock generation and reproduction, in radio transmitter and receiver circuits for generation of signals at radio frequencies, and so forth.

A typical PLL includes a phase detector coupled to receive a reference signal, a low pass filter coupled to the output of the phase detector, and a voltage controlled oscillator (VCO). The output of the VCO may provide the output signal of the PLL, and may also be fed back to an input of the phase detector via a feedback loop. In some instances, the output of the VCO may be divided before being provided to the phase detector. The phase detector is configured to compare the reference signal and the signal received from the feedback loop and adjust its output voltage accordingly.

One type of VCO commonly used in PLLs is based on a ring oscillator having an odd number of inverters (or inverting amplifiers) coupled together to form a ring (some embodiments may be implemented using an even number of inverters). The frequency of a signal output by such a ring oscillator may be varied based on a voltage provided thereto. More particularly, when the voltage is increased, the frequency of the ring oscillator may also increase, while a decrease in voltage may result in a reduction of the frequency. In manufacturing circuits that utilize a ring oscillator-based VCO, it may be necessary to control for variations in process, voltage, and temperature to ensure satisfactory operation with respect to such factors as jitter, phase error, and so on.

SUMMARY OF THE DISCLOSURE

A method and circuitry for calibrating the gain of a VCO is disclosed. In one embodiment, a circuit includes a comparator configured to determine a gain of a VCO (voltage controlled oscillator) is within a specified gain range, wherein the comparator is configured to provide a first indication if the VCO gain is not within the specified gain range and a second indication if the VCO is within the specified gain range. The circuit further includes a control unit coupled to the comparator, wherein the control unit is configured to, upon occurrence of at least a first cycle of a clock signal, cause adjustment of the VCO gain responsive to receiving the first indication. For each one or more successive cycles of the clock signal, the control unit is configured to cause corresponding adjustments of the VCO gain until the comparator provides the second indication, wherein the control unit is further configured to discontinue adjustments to the VCO gain responsive to receiving the second indication In one embodiment, a method includes determining if a gain of a VCO (voltage controlled oscillator) is within a specified gain range and providing a first indication if the VCO gain is not within a specified gain range. The method further includes adjusting the VCO gain responsive to providing the first indication and repeating said comparing, said providing the first indication, and said adjusting the VCO gain until the VCO gain is in the specified range. A second indication may be provided responsive to determining that the VCO gain is in the specified gain range, and adjustment of the VCO gain value is discontinued responsive to providing the second indication.

BRIEF DESCRIPTION OF THE DRAWINGS

Other aspects of the invention will become apparent upon reading the following detailed description and upon reference to the accompanying drawings in which:

FIG. 7 is a block diagram of one embodiment of a carrier medium including a data structure describing a circuit.

Figure 1:
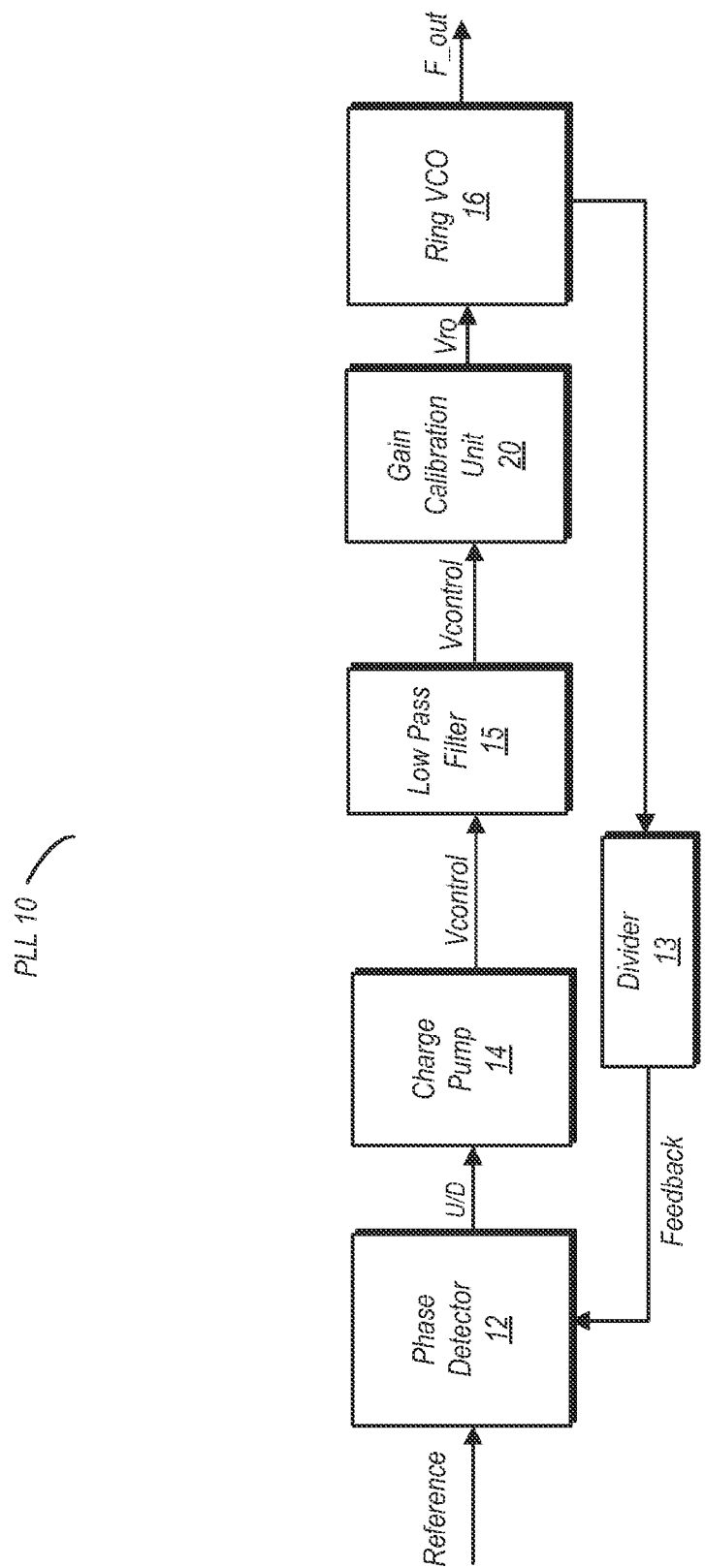
FIG. 1 is a block diagram of one embodiment of a phase-locked loop (PLL)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

A circuit and method for calibrating the gain of a voltage-controlled oscillator (VCO) is described below by way of the examples shown in the drawings. In one embodiment, the method may be directed to calibrating the VCO gain (i.e. Hz/V) by adjusting it into a predetermined gain range. The calibration may be performed by a gain calibration circuit coupled to the VCO. Both the VCO and the gain calibration circuit may be incorporated into a phase locked loop (PLL). The VCO gain may be based on a first voltage (e.g., a control voltage) that may be set according to a signal received from a phase detector, via a low pass filter. The VCO gain may be set such that the control voltage is within a specified range that is based on a reference voltage. Incremental adjustments may be made to the control voltage (and thus the VCO gain) until it is within the specified range. By controlling the VCO gain, various adverse affects (e.g., jitter) associated with VCO operation may be minimized.

With respect to the transistors shown in various drawings, it is noted that PMOS (p-channel metal oxide semiconductor) transistors are designated with a 'P' (e.g., P1, P2, etc.), while NMOS (n-channel metal oxide semiconductor) transistors are designated with an 'N' (e.g. N1, N2, etc.). Furthermore, while PMOS and NMOS transistors are shown in various in the circuit topologies of various drawings, it is noted that these arrangements are not intended to be limiting, and that embodiments of circuitry having the opposite polarity (and corresponding arrangements) are possible and contemplated for any of the embodiments discussed below.

Phase Locked Loop:

Turning now to FIG. 1, a block diagram of one embodiment of a phase-locked loop (PLL) is shown. In the embodiment shown, PLL 10 includes a phase detector 12 which is coupled to receive a reference signal (e.g., a reference clock signal), 'Reference', and a signal from a feedback path. Phase detector 12 is coupled to provide an up/down ('U/D') signal to charge pump 14. The control voltage, 'Vcontrol' is based on the output of charge pump 14, and may thus change responsive to the up/down signal. Low pass filter 15 is coupled to receive the control voltage from charge pump 14. A filtered version of the control voltage may be provided from low pass filter 15 to gain calibration unit 20. Based on the filtered control voltage received from low pass filter 15, gain calibration unit 20 is configured to generate a tuning voltage 'Vro'. Ring VCO 16 is coupled to receive the tuning voltage from gain calibration unit 20, and is configured to generate an output signal, 'F_out', at a frequency that corresponds to the received tuning voltage. Ring VCO 16 is also configured to provide a signal (which may be the same signal as 'F_out') to divider 13 via the feedback path. Divider 13 is configured to divide the frequency of the received signal. Phase detector 12 may receive the divided signal generated by divider 13. It is noted that divider 13 is optional, and that other embodiments in which no divider is present are possible and contemplated. In addition, feedback loops having other configurations and thus including other components (e.g., multiplexers, multiple dividers, etc.) are also possible and contemplated.

In the embodiment shown, phase detector 12 is configured to compare the reference signal to the signal received from divider 13. Based on the comparison, phase detector 12 may generate one of an 'up' signal or a 'down' signal. In one embodiment, these signals may be complementary states conveyed on a single signal line, while in other embodiments, separate signal lines may be provided for each of these signals. The 'up' signal may be generated when a comparison indicates that the frequency of the PLL output signal, 'F_out', is less than the desired frequency and thus needs to be increased, (moved up'). Conversely, the 'down' signal may be generated when a comparison indicates that the frequency of the PLL output signal is greater than the desired frequency and thus needs to be decreased (moved down'). Charge pump 14 may increase the control voltage responsive to receiving the 'up' signal, or decrease the control voltage responsive to receiving the 'down' signal. It is noted that embodiments are possible and contemplated wherein the control voltage is decreased from a high value (rather than increased from a low value) are possible and contemplated.

Low pass filter 15 may be used to filter out high frequency fluctuations of the control voltage in order to increase stability of PLL 10. The filtered control voltage signal may be provided to gain control unit 20, which may use this voltage to generate a tuning voltage, 'Vro', for tuning ring VCO 16. Ring VCO 16 may tune to a frequency that corresponds to the particular tuning voltage provided by gain control unit 20. In addition to tuning ring VCO 16, gain control unit 20 may also be configured to perform a VCO gain calibration routine in order to set the VCO gain within a specified gain range. An example of a gain control unit 20 configured to perform the gain calibration routine will be discussed in further detail below.

Ring VCO 16, which will also be discussed in further detail below, is a ring oscillator that is tunable based on the supply voltage provided thereto, 'Vro' in this particular example. An output signal, 'F_out', may be provided by ring VCO 16 at a frequency specified according to the reference frequency and the divisor of divider 13. In addition, ring VCO may provide a signal into the feedback loop and to the divider. In some embodiments, the signal provided into the feedback loop may be the same as the output signal, 'F_out'.

Figure 2:
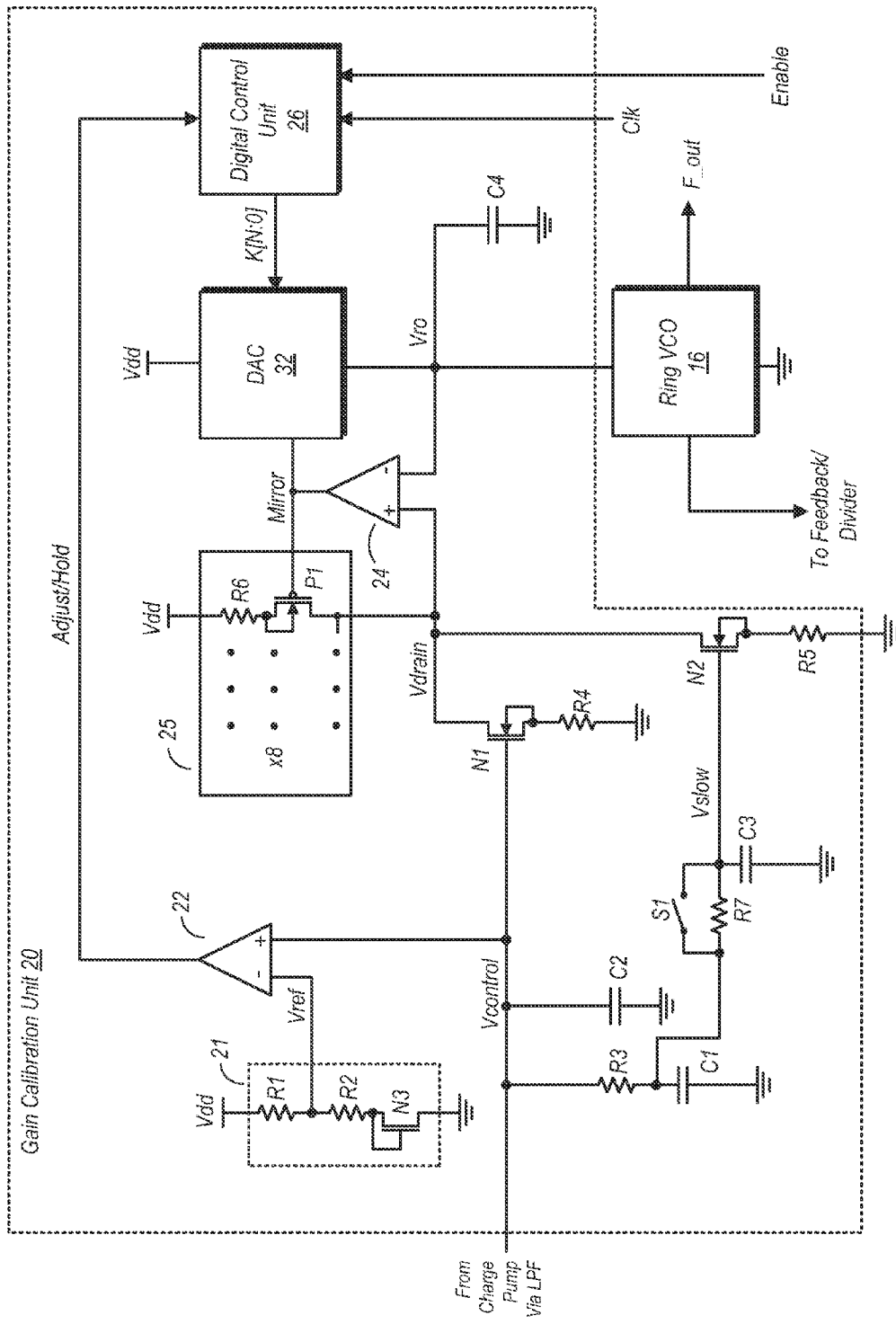
FIG. 2 is a schematic diagram illustrating one embodiment of a gain calibration unit coupled to a ring voltage controlled oscillator (VCO)

Gain Calibration Circuit:

FIG. 2 is a schematic diagram illustrating one embodiment of a gain calibration unit coupled to a ring VCO. In the embodiment shown, gain control circuit 20 includes an input node for receiving a first voltage (i.e. a control voltage), and an output node configured to provide a second voltage (i.e. a tuning voltage) intended for tuning ring VCO 16. The control voltage may be provided from a charge pump (e.g., charge pump 14 of FIG. 1) via a low pass filter (e.g., low pass filter 15 of FIG. 1). In the embodiment shown, the control voltage received by gain calibration circuit 20 provides the basis for determining the gain of ring VCO 16. More particularly, the gain (Hz/V) of ring VCO 16 may be determined by the expression (VCO output frequency/Control Voltage).

The control voltage may be received on the gate terminal of transistor N1, while voltage Vslow (which will be discussed further below) is received on the gate terminal of transistor N2. The current on node Vdrain may be divided between transistors N1 and N2 and their respectively coupled resistors R4 and R5. Node Vdrain in the embodiment shown is coupled to receive current via the transistors of transistor bank 25. In this particular embodiment, transistor bank 25 includes eight instances of a resistor-transistor combination (such as R6 and P1 shown here) coupled in a parallel combination. Transistor bank 25, along with amplifier 24 and the transistors of DAC 32 (which will be discussed below) are coupled at node 'Mirror' to form a current mirror circuit. Accordingly, the current through transistor bank 25 may be mirrored as the output current of DAC 32, which is received on node 'Vro'. The voltage present on the output node of DAC 32, 'Vro', is the tuning voltage used to tune ring VCO 16 to a particular frequency.

The frequency of the output signal provided by ring VCO 16 may change corresponding to a change in the control voltage that result from a corresponding change of frequency to the reference clock signal provided to phase detector 12. If the frequency of the reference clock changes, the charge pump may raise or lower the control voltage accordingly. Such a change in the control voltage may in turn affect the amount of current flowing through transistor N1, and thus through resistor R4. The change in current through N1 and R4 thus results in a change in the voltage present on node 'Vdrain'. Amplifier 24 may respond to this change by driving the node 'Mirror' based on the difference between the respective voltages on nodes 'Vdrain' and 'Vro'.

Turning momentarily to a schematic diagram illustrating one embodiment of a DAC 32 is shown. In the embodiment shown, DAC 32 includes a plurality of circuits 33-37, each of which includes one or more PMOS transistors 'P' coupled in series with a respective resistor 'R'. Each of resistors 'R' may have substantially the same resistance, while each of the transistors 'P' may be substantially of the same size and electrical characteristics. A gate terminal of the PMOS transistor in circuit 37 is coupled to the 'Mirror' node in this particular embodiment, and remains active during circuit operation since its drain terminal is hardwired to node 'Vro' (i.e. no switch is provided, and thus it cannot be switched off). The respective gate terminals for each of the PMOS transistors in circuits 33-36 are coupled to the "Mirror" node. Each of the transistors of circuits 33-36 may be activated when its respective one of switches S2-S5 is closed. For example, each of the transistors of circuit 33 may be activated when switch S2 is closed.

Switches S2-S5 may be implemented using passgates, transistors, or any other type of switching mechanism. Digital control unit 26 may provide a digital code in via signals K [3:0] in order to activate selected ones of circuits 33-36. For example, if the digital code in K [3:0] as output by digital control unit 26 is 1011, switches S2, S4, and S5 will be closed (and thus, circuits 33, 35, and 36 are active), while switch S3 is open (and thus circuit 34 is inactive). When active, given ones of circuits 33-36 place one or more transistor-resistor circuits in parallel (between the supply voltage node 'Vdd' and node 'Vro') with the transistor resistor combination of circuit 37. For example, if switch S2 is closed, the eight transistor-resistor circuits of circuit 33 are placed in parallel with transistor-resistor circuit 37.

It is noted that circuits 33-36 are binary-weighted with respect to each other in this embodiment of DAC 32 (although embodiments utilizing a thermometer coded DAC are also possible and contemplated). Thus, circuit 33 includes eight transistor-resistor circuits, circuit 34 includes four transistor-resistor circuits, and so forth. Circuit 33 may be activated by assertion of the most significant one of bits K [3:0], circuit 34 may be activated by the next most significant one of bits K [3:0], and so forth. Including the transistor-resistor circuit 37, up to sixteen transistor-resistor circuits may be placed in parallel between 'Vdd' and 'Vro' in this embodiment. Since the PMOS transistor of circuit 37 is hardwired to remain active, the embodiment shown may always have at least one transistor-resistor circuit is active between 'Vdd' and 'Vro' when the circuit is operating.

As previously noted, the transistors of DAC 32 are coupled in a current mirror configuration with the transistors of transistor bank 25. The reference current may be set according to the voltages on nodes 'Vdrain' and 'Mirror', while the output current (on node 'Vro') may vary according to which ones of circuits 33-36 of DAC 32 are active.

Returning to FIG. 2, the embodiment of gain calibration unit 20 is arranged such that the control voltage may be altered while substantially maintaining the frequency of the output signal provided by ring VCO 16. This may provide the basis for performing a gain calibration routine, which will now be explained in further detail.

At the beginning of operation, PLL 10 may lock to an output signal frequency specified by the frequency of the reference signal and a divisor setting provided by divider 13 in the feedback loop. More particularly, phase detector 12 may generate and provide up or down signals to charge pump 14 until the control voltage is set to a level corresponding to the desired output frequency. Moreover, when performing the initial frequency lock of PLL 10, digital control unit 26 may output all logic 1's on K [N:0]

If the VCO gain value is outside of a certain range (e.g., too high), performance degradation due to problems such as excessive jitter of the output signal may arise. Accordingly, the gain calibration routine performed by gain calibration unit 20 may be used to set the VCO gain into a range in which such problems are minimized.

In the embodiment shown, the desirable VCO gain range may be set according to a reference voltage provided on node 'Vref'. The reference voltage may be provided by reference voltage generator 21 in the embodiment shown, to an input of comparator 22. The other input of comparator 22 in this embodiment is coupled to receive the control voltage from node 'Vcontrol'. AC (alternating current) noise on node 'Vcontrol' may be shorted to ground by capacitor C2.

In the arrangement shown in FIG. 2, if the control voltage is less than reference voltage, comparator 22 may provide a first indication on its output node (labeled 'Adjust/Hold').

The first indication, a logic low voltage in this particular example, may be received by digital control unit 26. Responsive to receiving the first indication, digital control unit 26 may begin performing incremental changes to the output of DAC 32 by adjusting the digital code provided on K [N:0].

It should be noted that, as used herein, the term 'incremental' and related terms such as 'incrementing' are intended to be interpreted generically, and are not intended to convey a particular direction of change. Accordingly, a change that is referred to as 'incremental' may be the result of incrementing or decrementing a particular value, depending on the embodiment.

Since the initial lock of the output frequency of PLL 10 was performed with all transistors of DAC 32 in an active state, digital control unit 26 may change the digital code conveyed on K [N:0] to deactivate selected ones of the transistors therein. As an example using the embodiment of DAC 32 shown in FIG. 3, digital control unit 26 may change the digital code from '1111' to '1110', thereby deactivating one of the sixteen transistor-resistor circuits. Deactivating one of the transistor-resistor circuits in DAC 32 results in a greater resistance between the supply voltage node and 'Vro'. Thus, since the current through DAC 32 is dependent on transistor bank 25 of the current mirror (and thus remains substantially unchanged at this point), the increased resistance between the supply voltage node and 'Vro' results in this increased resistance dropping a greater portion of the voltage between 'Vdd' and ground. As a result, the voltage on node 'Vro' will drop, and the frequency of the output signal provided by ring VCO 16 will also drop.

If the frequency of the reference signal has not changed, phase detector 12 may detect the drop in frequency of the signal received from the feedback loop. Responsive to detecting this frequency drop in the feedback signal, phase detector 12 may assert an 'up' signal to charge pump 14. Responsive to receiving the 'up' signal, charge pump 14 may increase the control voltage that is received on the 'Vcontrol' node of gain control unit by way of low pass filter 15. The increase in the control voltage on the gate of transistor N1 may result in an decrease of the voltage on node 'Vdrain', and therefore a greater difference between the voltages on 'Vdrain' and 'Vro'. This difference is reflected on the output of amplifier 24 on the 'Mirror' node. Transistor bank 25 may respond by increasing the amount of current between 'Vdd' and 'Vdrain', with the increased current being mirrored through DAC 32, and thus through node 'Vro'. The voltage on node 'Vro' may rise correspondingly, thereby causing the frequency of the output signal provided by ring VCO 16 to return to the specified frequency. Since the control voltage has increased relative to the specified frequency in this example, the VCO gain is decreased correspondingly.

The process described above may be repeated for a number of iterations, until the VCO gain is within a specified range. In this particular embodiment, the specified VCO gain range, and thus a specified voltage range for the control voltage, are based on the reference voltage. More particularly, when the control voltage is equal to or greater than the reference voltage in this embodiment, both the control voltage and the VCO gain are within their specified ranges. Accordingly, the process described above may be repeated for the number of iterations required to set the control voltage into the specified voltage range, and thus the VCO gain into the specified gain range.

At the point when the control voltage is equal to or greater than the reference voltage, the state of the output provided by comparator 22 may change, providing a second indication that is a complement of the first indication. The second indication ('Hold') may indicate that the control voltage, and thus the VCO gain, are within their respective specified ranges. Responsive to detecting the change of state on the 'Adjust/Hold' signal line, digital control unit 26 may hold the digital code K [N:0] at its most recent state, thereby holding the output of DAC 32, 'Vro' steady in terms of voltage and current.

As shown in FIG. 2, digital control unit 26 is coupled to receive a clock signal ('Clk'), and may change the digital code once per cycle of the clock signal. Performing the gain calibration synchronous with the clock signal may allow sufficient time for PLL 10 to re-lock at the specified frequency each time the output of DAC 32 is changed. Accordingly, the gain calibration routine may be performed by adjusting the control voltage in increments and allowing PLL 10 to settle before performing the next adjustment. Digital control unit 26 is also coupled to receive an enable signal in the embodiment shown. The calibration routine described above may be performed when digital control unit 26 is enabled. Digital control unit 26 may be inhibited from changing the digital code of K [N:0] when not enabled.

In the embodiment shown, gain calibration unit 20 includes a reference voltage circuit 21 that is configured to produce the reference voltage. Reference voltage circuit 21 includes a resistor voltage divider including resistors R1 and R2, with the reference voltage taken at the injunction of these two resistors. Transistor N3 is coupled between resistor R2 and ground. Transistor N3 may provide compensation for process variations that can occur during the manufacture of an IC (integrated circuit) upon which PLL 10 is implemented. It should be noted that other types of reference voltage circuits are possible and contemplated. For example, in one embodiment, a simple resistor divider circuit (sans transistor N3) may be used to generate the reference voltage. In another embodiment, a voltage regulator (which may or may not be adjustable) may be used to generate the reference voltage. In general, any suitable type of voltage generating circuit may be used to implement reference voltage circuit 21.

In the embodiment shown, gain control unit 20 includes two control paths, although these paths originate at the same point. The first of these control paths includes the node Vcontrol, the control operation provided on this node having been described above. The second of these two control paths includes the node Vslow, which is coupled to the gate terminal of transistor N2. The first control path comprising the node Vcontrol is the primary control path in this embodiment, and it is through this control path that the bandwidth of PLL 10 is determined. The second control path comprising node Vslow may be used to determine the center frequency of VCO 16. The bandwidth control provided by the second control path may be minimal (if not negligible) compared to the first.

The Vcontrol node may serve as the point of origin for both of these paths. Node Vslow may be coupled to Vcontrol via an RC (resistive-capacitive) filter including R3 and C1, as well as by resistor R7. Capacitor C3 may short AC noise to ground from node Vslow. Switch 51 may be used to bypass resistor R7 when closed. During the initial lock of PLL 10 and the gain calibration routine described above, switch 51 may be closed. Otherwise, during post-calibration normal operation, switch 51 may be open.

Figure 4:
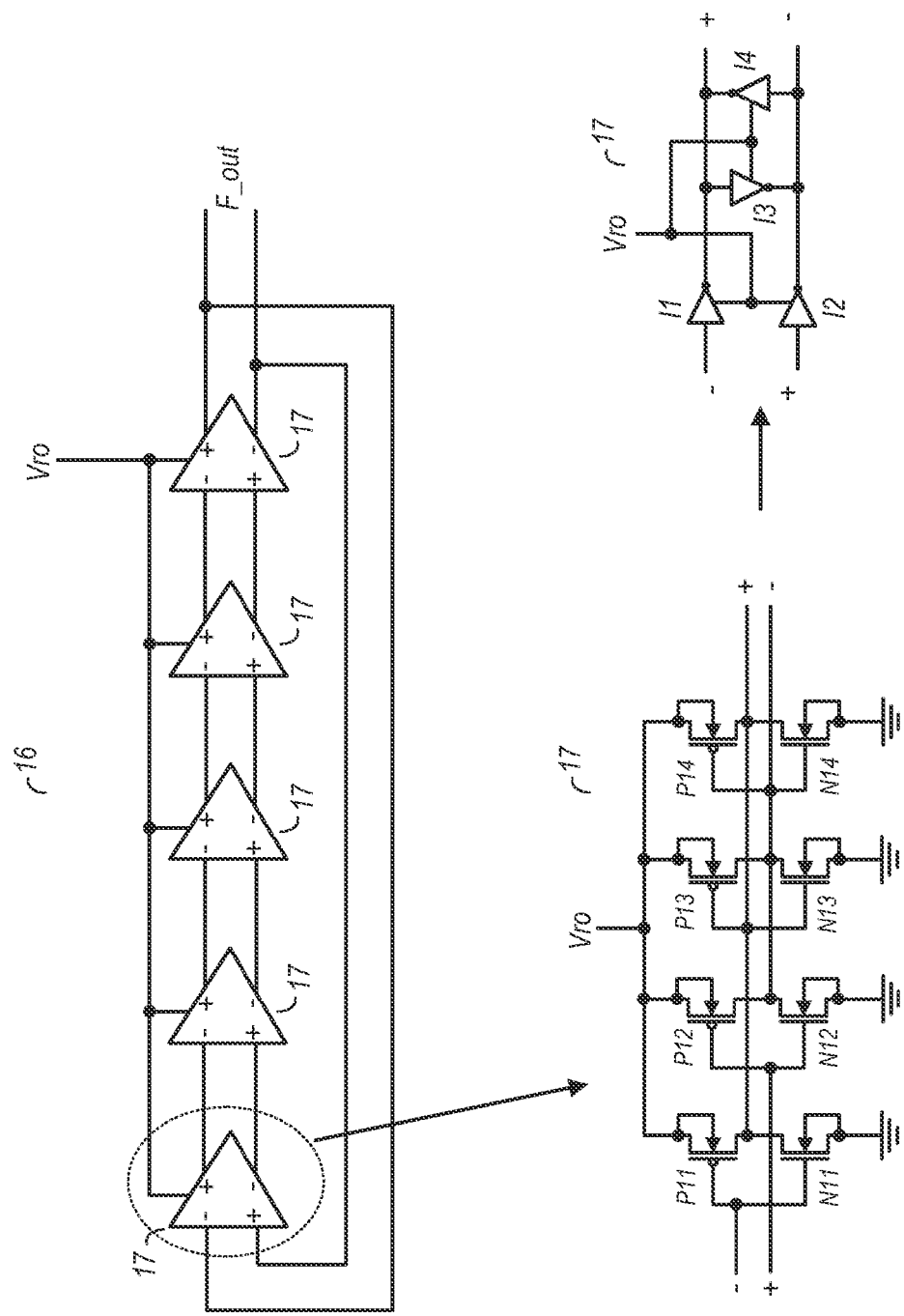
FIG. 4 is a schematic diagram illustrating one embodiment of a ring VCO.

Voltage Controlled Ring Oscillator:

FIG. 4 is a schematic diagram illustrating one embodiment of a ring VCO. In the embodiment shown, ring VCO 16 is formed of a number of inverting amplifiers 17 (five in this example) coupled in series, with the output of the last one of the series coupled to the input of the first one in order to close the ring. Each of the inverting amplifiers 17 in this example is comprised of a number of inverters (e.g., P11 and N11, P12 and N12, etc.) coupled as shown. Inverter amplifier 17 is also shown in FIG. 4 using logic symbology, illustrating the connections of inverter 11-14. Each of the inverters in an inverter amplifier 17 (and thus ring VCO 16 as a whole) is coupled to receive a voltage from node Vro in the embodiment shown. The frequency of oscillation of ring VCO 16 may vary dependent on this voltage.

It is noted that the embodiment shown of ring VCO 16 is but one of many possible embodiments. Other embodiments of a ring VCO may be implemented using elements different than inverting amplifiers 17 as shown herein, as well as with different numbers of elements. In general, many different types of ring VCO's may be suitable for use with PLL 10 as shown in FIG. 1.

Figure 5:
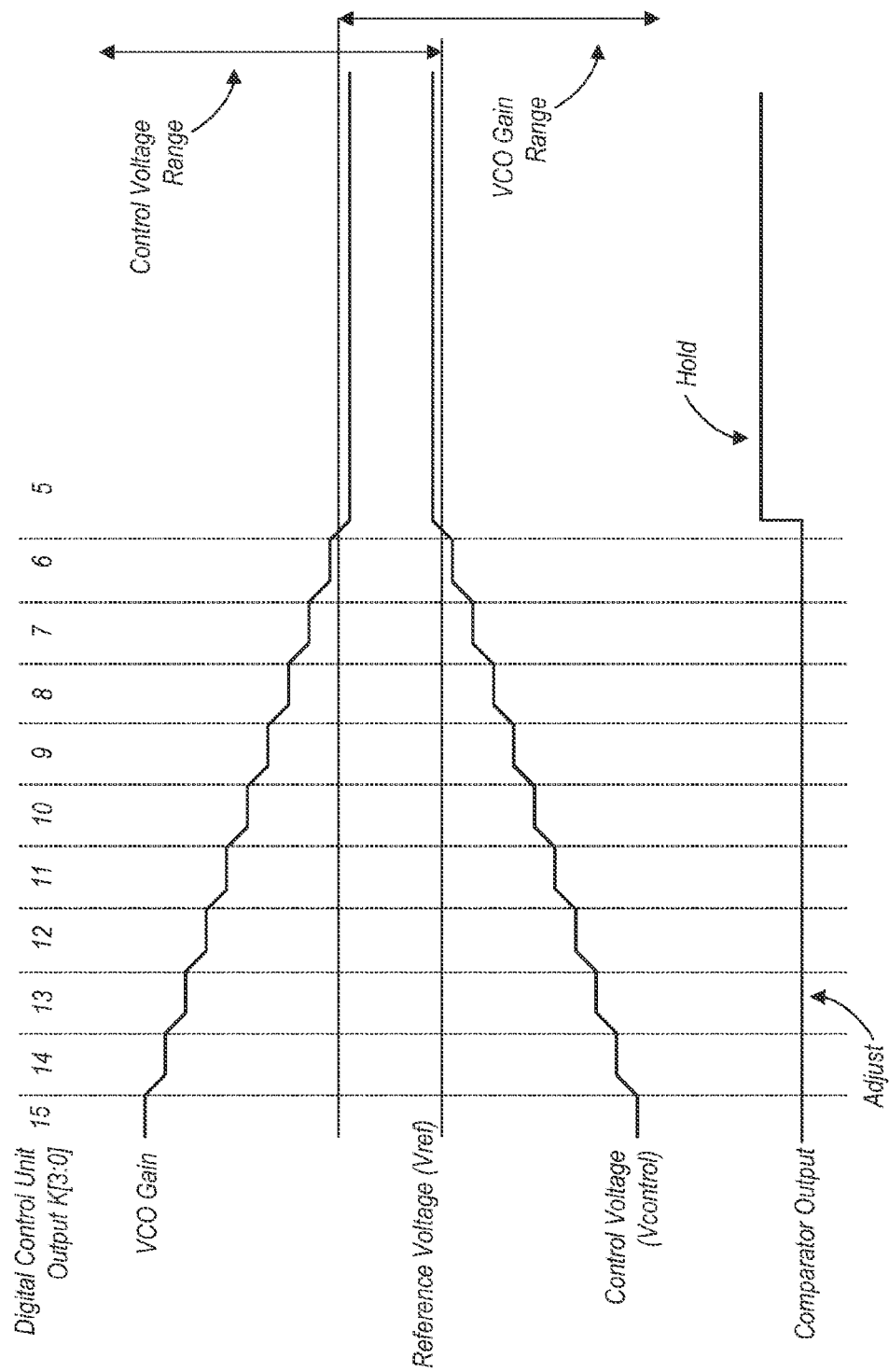
FIG. 5 is a graphic illustration of one embodiment of a method for calibrating the gain of a VCO.
Figure 6:
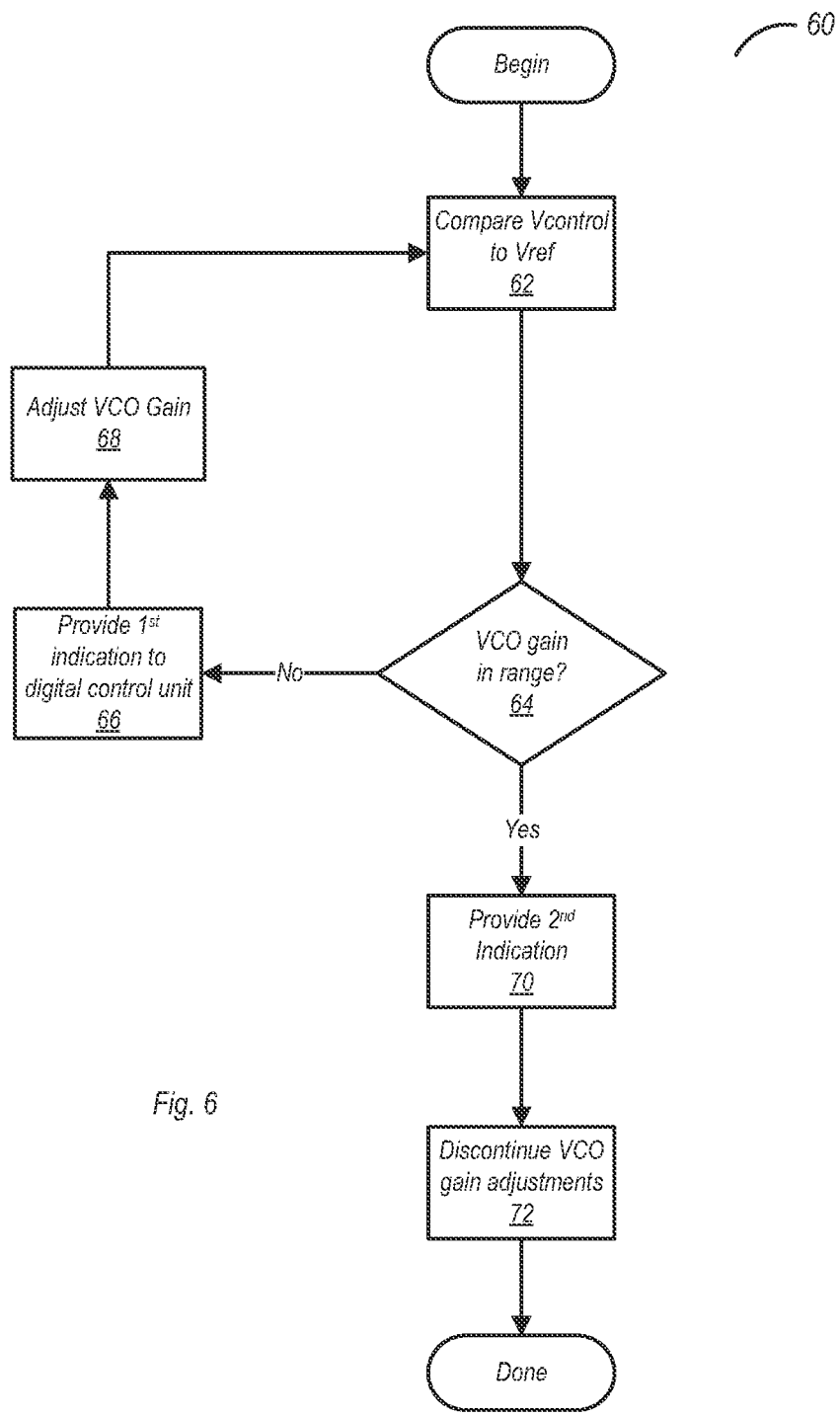
FIG. 6 is a flow diagram of one embodiment of a method for calibrating the gain of a VCO.

Method for VCO Gain Calibration:

FIGS. 5 and 6 illustrate one embodiment of a method for calibrating the gain of a ring VCO. The calibration routine may be performed in order to adjust the VCO gain into a specified gain range. A determination of whether or not the VCO gain is within a specified range may be made by comparing the control voltage to the reference voltage. Accordingly, when the control voltage is adjusted to being within a specified voltage range, the VCO gain may be considered to be within the specified gain range.

Figure 3:
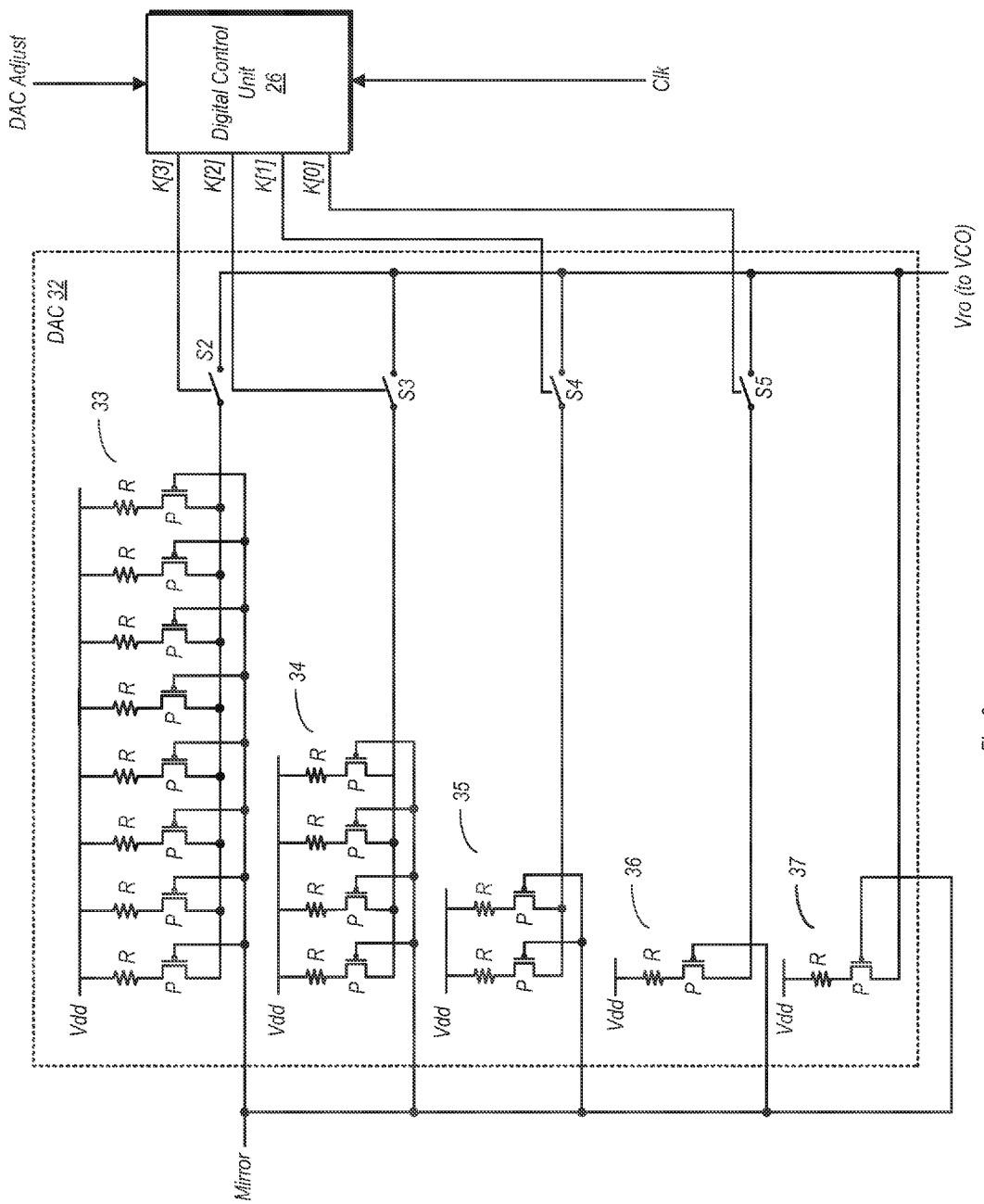
FIG. 3 is a schematic diagram illustrating one embodiment of a digital-to-analog converter (DAC) controlled by a digital control unit.

The method embodiments of gain calibration discussed herein will be discussed in reference to the embodiment of PLL 10 of FIG. 1 and its various components illustrated in FIGS. 2-4. However, the method may be applied to other embodiments of a PLL. It is also noted that the method discussed herein may be performed after PLL 10 has achieved a lock at a frequency specified by the reference and feedback signals provided to phase detector 12. The VCO gain for the embodiment of PLL 10 discussed herein may be calculated based on the frequency of the output signal and the control voltage received by gain calibration unit 20.

Turning now to FIG. 5, a graphic illustration of one embodiment of a method for calibrating the gain of ring VCO 16 in PLL 10 is shown. In the embodiment shown, PLL 10 may begin with the VCO gain at a relative high point, and thus the control voltage relatively low. The VCO gain may be adjusted by increasing the control voltage (and thus decreasing the VCO gain) until both are within their respective specified ranges.

As noted above, gain calibration unit 20 includes digital control unit 26 configured to output a digital code. In the embodiment shown, the digital code, K [3:0] has a maximum binary value equivalent to decimal 15, and it is at this value at which the initial lock of PLL occurs. The calibration routine may begin by comparator 22 comparing the control voltage to the reference voltage. In the example shown, the control voltage is less than the reference voltage at this point, thus indicating that both the control voltage and the VCO gain are outside of their respective specified ranges. Responsive to determining that the control voltage is less than the reference voltage, comparator 22 may output a logic low signal, which is equivalent to the 'Adjust' indication in this embodiment. The 'Adjust' indication may be provided to digital control unit 26, which may respond by decreasing the value of the digital code by one on the next clock cycle. The decrease of the value output by digital control unit 26, from the binary equivalent of decimal 15 to the binary equivalent decimal 14 may result in an adjustment to DAC 32 and thus a momentary drop in the voltage on node Vro. However, the operation of PLL 10 may pull voltage on node Vro back up so that PLL 10 may re-lock at the specified frequency.

The comparison described above may be repeated a number of times. For each comparison where the control voltage is less than the reference voltage (and thus both the control voltage and VCO gain are not within their specified ranges), the comparator may continue outputting a logic low 'Adjust' signal. Digital control unit 26 may reduce the value of the digital code once each clock cycle. This in turn may result in incremental increases of the control voltage, and thus incremental decreases (i.e. decrementing) of the VCO gain. The increases in the control voltage may occur in accordance with the operation described above in reference to FIG. 2. Performing this method in an incremental manner may thus allow PLL 10 to re-lock and settle at the specified frequency before digital control unit samples the next comparison.

In this particular example, when the digital code output by digital control unit 26 reaches the binary equivalent of decimal 5, the control voltage may be adjusted to a value that exceeds the reference voltage. At this point in the process, both the control voltage and the VCO gain are within their specified ranges, as illustrated. When comparator 22 detects that the control voltage exceeds the reference voltage, its output may switch from low (Adjust') to high, thereby providing the 'Hold' indication. Responsive to detecting the 'Hold' indication, digital control unit 26 may discontinue further changes to the digital code, and thus adjustments to the control voltage and the VCO gain are also discontinued. At this point, the calibration procedure is complete.

It is noted that FIG. 5 is exemplary, and other embodiments are possible and contemplated. In general, the method described in conjunction with FIG. 5 results in adjustments to a voltage upon which a VCO gain is calibrated. The adjustments may occur in increments, under digital control, until the voltage and thus the VCO gain are with their specified ranges, which may be selected in order to provide optimal operation of the VCO and thus the PLL in which the VCO is implemented.

FIG. 6 is a flow diagram of the embodiment of gain calibration method described above. In the embodiment shown, method 60 begins with a comparison of a control voltage to a reference voltage (block 62). As noted above, the control voltage may provide the basis upon which a VCO gain value is determined. Based on the comparison, it is determined if the VCO gain is within a specified or desired range (block 64). If the VCO gain is not within the specified range (block 64, no), a first indication is provided to a digital control unit (block 66). Responsive to receiving the indication, the digital control unit may incrementally change the control voltage, thereby causing a corresponding incremental adjustment to the VCO gain (block 68). The method may then return to block 62, and may be repeated as many times as necessary to adjust the VCO gain to within the specified range.

If the comparison operation determines that the VCO gain is within the specified range (block 64, yes), a second indication is provided (block 70). Responsive to receiving the second indication, adjustments to the VCO gain may be discontinued (block 72), and thus the VCO gain calibration procedure is complete.

It is noted that while descriptions provided in reference to FIGS. 5 and 6 may be applied to the various circuits shown in FIGS. 1-4, the methods discussed herein are not limited to these circuits. In contrast, the methods described in conjunction with FIGS. 5 and 6 may be performed for any type of VCO and any type of PLL which is configured to enable a VCO gain calibration in accordance therewith.

Computer Readable Medium:

Turning next to FIG. 7, a block diagram of a computer accessible storage medium 300 including a database representative of the PLL 10 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LP-DDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the database of the PLL 10 carried on the computer accessible storage medium 300 may be a database which can be read by a program and used, directly or indirectly, to fabricate the hardware comprising the PLL 10. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates and other circuits from a synthesis library. The netlist comprises a set of gates and other circuitry which also represent the functionality of the hardware comprising the PLL 10. The netlist may then be placed and routed to produce a data set describing geometric shapes to be applied to masks. The masks may then be used in various semiconductor fabrication steps to produce a semiconductor circuit or circuits corresponding to the PLL 10. Alternatively, the database on the computer accessible storage medium 300 may be the netlist (with or without the synthesis library) or the data set, as desired.

While the computer accessible storage medium 300 carries a representation of the PLL 10, other embodiments may carry a representation of any portion of the PLL 10, as desired, including any set of agents (e.g. gain calibration unit 20, ring VCO 16, etc.), portions of an agent, e.g. digital control unit 26, DAC 32, etc.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
    a comparator configured to assert a first indication responsive to a voltage controlled oscillator (VCO) gain above a specified gain value, and further configured to assert a second indication responsive to the VCO gain being below the specified gain value; and
    a control unit configured to, upon an occurrence of at least a first cycle of a clock signal concurrent with the comparator providing the first indication, cause an adjustment of the VCO gain, wherein the control unit is configured to output a digital code corresponding to the VCO gain and further configured to adjust the VCO gain by changing the digital code;

wherein, upon occurrence of one or more successive cycles of the clock signal, the control unit is configured to cause corresponding additional adjustments of the VCO gain until the comparator provides the second indication, wherein the comparator is configured to determine whether the VCO gain is below the specified gain value by determining whether a first voltage is above a specified voltage, and wherein the control unit is further configured to, responsive to the comparator providing the second indication, discontinue causing adjustments to the VCO gain by discontinuing changing the digital code;

wherein the circuit further comprises a digital-to-analog converter (DAC), wherein the control unit is configured to cause an adjustment of an output current provided by the DAC responsive to receiving the first indication from the comparator, wherein adjusting the output current of the DAC causes a change of value to a second voltage, and wherein the control unit is further configured to discontinue causing adjustments of the output current provided by the DAC responsive to receiving the second indication from the comparator.

2. The circuit as recited in claim 1, wherein the comparator is configured to compare the first voltage to a reference voltage in order to determine whether the first voltage is above the specified voltage.

3. The circuit as recited in claim 1, further comprising a charge pump configured to cause an adjustment of the first voltage responsive to the change of value of the second voltage such that adjusting the first voltage causes the second voltage to return to its value prior to adjusting the output current.

4. The circuit as recited in claim 1, wherein the DAC is coupled to provide the second voltage to the VCO, wherein a frequency of an output signal provided by the VCO is dependent upon the second voltage.

5. The circuit as recited in claim 1, wherein the control unit is configured to provide the digital code to the DAC, wherein an amount of output current provided by the DAC corresponds to the digital code.

6. The circuit as recited in claim 5, wherein the control unit is configured to decrement the digital code responsive to receiving the first indication, and further configured to hold the digital code at a current value responsive to receiving the second indication.

7. The circuit as recited in claim 1, wherein the VCO is a ring oscillator.

8. A method comprising:
asserting a first indication if a voltage controlled oscillator (VCO) gain is above a specified gain value;
adjusting, upon an occurrence of at least a first cycle of a clock signal concurrent with providing the first indication, the VCO gain responsive to a comparator asserting the first indication, wherein said adjusting comprises a control circuit changing a digital code output therefrom, wherein adjusting the VCO gain is performed by adjusting an output current provided by a digital-to-analog converter (DAC) responsive to said asserting the first indication, wherein adjusting the output current causes a change of value of a second voltage;
repeating said comparing, said providing the first indication, and said adjusting the VCO gain upon occurrence of each of one or more successive cycles of the clock signal until the VCO gain is below the specified gain value, wherein determining whether the VCO gain is below the specified gain value is performed by determining whether a first voltage is above a specified voltage;
asserting a second indication and de-asserting the first indication responsive to the VCO gain is below the specified gain value, said asserting and de-asserting being performed by the comparator; and
discontinuing said adjusting responsive to said asserting the second indication, wherein said discontinuing comprises discontinuing changes to the digital code output from the control circuit.

9. The method as recited in claim 8, wherein determining whether the first voltage is above the specified voltage comprises comparing the first voltage to a reference voltage.

10. The method as recited in claim 9 further comprising providing the first indication if the first voltage is less than the reference voltage and providing the second indication if the first voltage is greater than the reference voltage.

11. The method as recited in claim 8, further comprising adjusting the first voltage responsive to the change of value of the second voltage, wherein adjusting the first voltage causes the second voltage to return to its value prior to adjusting the output current.

12. The method as recited in claim 8, further comprising providing the second voltage to the VCO, wherein a frequency of an output signal provided by the VCO is dependent upon the second voltage.

13. The method as recited in claim 8, further comprising providing the digital code to the DAC, wherein an amount of output current provided by the DAC corresponds to the digital code, wherein providing the digital code comprises:
decrementing the digital code responsive to assertion of the first indication; and
maintaining the digital code at a current value responsive to assertion of the second indication.

14. The method as recited in claim 13, further comprising beginning said decrementing at a maximum digital value that can be provided by the control unit.

15. The method as recited in claim 8, wherein said adjusting the VCO gain comprises incrementally adjusting the VCO gain by one increment per cycle of the clock signal.

16. The method as recited in claim 8, wherein the VCO is a ring oscillator.

17. A non-transitory computer readable medium comprising a data structure which is operated upon by a program executable on a computer system, the program operating on the data structure to perform a portion of a process to fabricate an integrated circuit including circuitry described by the data structure, the circuitry described in the data structure including:
a comparator configured to provide a first indication if a VCO (voltage controlled oscillator) gain is above a specified gain value, and a second indication if the VCO gain is below the specified gain value, and further configured to determine whether the VCO gain is above the specified gain value by determining whether a first voltage is less a specified voltage, wherein the specified voltage is defined by at least a reference voltage, wherein the comparator is configured compare the first voltage to the reference voltage in order to determine whether the first voltage is less than the specified voltage;
a control unit configured to, upon an occurrence of at least a first cycle of a clock signal, cause an adjustment of the VCO gain responsive to receiving the first indication, wherein the control unit is configured to cause adjustment of the VCO gain by changing a value of a digital code output therefrom, wherein, upon occurrence of one or more successive cycles of the clock signal, the control unit is configured to cause corresponding additional adjustments of the VCO gain until the comparator provides the second indication, wherein the control unit is further configured to discontinue causing adjustments to the VCO gain responsive to the comparator providing the second indication, wherein the control unit is configured to discontinue causing adjustments to the VCO gain by discontinuing changes to the digital code;

a digital-to-analog converter (DAC), wherein the control unit is configured to cause an adjustment of an output current provided by the DAC responsive to receiving the first indication from the comparator, wherein adjusting the output current of the DAC causes a change of value to a second voltage, wherein a frequency of an output signal provided by the VCO described in the data structure is dependent upon the second voltage; and a charge pump configured to cause an adjustment of the first voltage responsive to the change of value of the second voltage, wherein adjusting the first voltage causes the second voltage to return to its value prior to adjusting the output current.

18. The non-transitory computer readable medium as recited in claim 17, wherein the data structure comprises one or more of the following types of data:
 HDL (high-level design language) data;
 RTL (register transfer level) data;
 Graphic Data System (GDS) II data.

19. The non-transitory computer readable medium as recited in claim 17, wherein the comparator described in the data structure is configured to provide the first indication if the first voltage is below the specified voltage, and further configured to provide the second indication if the first voltage is above the specified voltage.

* * * * *